United States Patent [19]

Partridge

[11] Patent Number: 5,798,143
[45] Date of Patent: Aug. 25, 1998

US005798143A

[54] CVD PROCESS FOR MAKING A HOLLOW DIAMOND TUBE

[75] Inventor: Peter George Partridge, Bristol, United Kingdom

[73] Assignee: The Secretary of State for Defence in Her Britannic Majesty's Government of the United Kingdom of Great Britain and Northern Ireland, United Kingdom

[21] Appl. No.: 765,792

[22] PCT Filed: Jul. 17, 1995

[86] PCT No.: PCT/GB95/01680

§ 371 Date: Jan. 15, 1997

§ 102(e) Date: Jan. 15, 1997

[87] PCT Pub. No.: WO96/02685

PCT Pub. Date: Feb. 1, 1996

[30] Foreign Application Priority Data

Jul. 18, 1994 [GB] United Kingdom ............ 9414444

[51] Int. Cl.[6] .................................................. C23C 16/26
[52] U.S. Cl. .................... 427/249; 427/178; 427/122; 427/299
[58] Field of Search ..................... 427/249, 122, 427/178, 299; 428/408; 423/446

[56] References Cited

FOREIGN PATENT DOCUMENTS

| | | |
|---|---|---|
| 0 470 447 A1 | 2/1992 | European Pat. Off. . |
| 0 550 202 A1 | 7/1993 | European Pat. Off. . |
| 0 559 329 A2 | 9/1993 | European Pat. Off. . |
| 59-55700 | 3/1984 | Japan . |
| 342648 | 3/1931 | United Kingdom . |

OTHER PUBLICATIONS

Chen et al., "An investigation of diamond growth on Ferrous metals", Applications of Diamond Films and Related Materials edited by V. Tzeng et al., 1991, pp. 137–142.

Motojima et al., J. Chem Vap. Deposition, 1(2), pp. 136–156 1992.

WPI Abstract Accession No. 92-247404/30 & JP 040168264 A; (Shinku) see abstract.

Proc. 3rd Int. Symp. Diamond Matter, Honolulu, 1993, Proceedings vol. PV 93-17, pp. 1036–1041; P.W. May et al., "Preparation of CVD Diamond Wires . . . ", see especially first compleete paragraph on p. 1037.

*Primary Examiner*—Roy V. King
*Attorney, Agent, or Firm*—Nixno & Vanderhye

[57] ABSTRACT

A method for producing hollow diamond tubes by diamond growth using chemical vapor deposition (CVD) techniques. Suitable substrate material, such as tungsten, molybdenum, copper or silicon, typically in the form of wire, having diamond nucleation sites is formed into a helix. The helix is then placed, or moved through, a CVD chamber for deposition of diamond on the helix. Suitable pitch and diameter of helix results in deposition diamond on the helix until such time as the growth surfaces of the diamond fuse to form a hollow diamond tube.

5 Claims, No Drawings

CVD PROCESS FOR MAKING A HOLLOW DIAMOND TUBE

This is a 35 U.S.C. § 371 of PCT/GB95/01680, filed Jul. 17, 1995.

This invention relates to a method of diamond-phase carbon coating of elongate substrate material by use of chemical vapour deposition (CVD) techniques. In particular, the invention relates to use of CVD techniques to produce hollow tubes having diamond-phase carbon inner and outer walls (hollow diamond tubes).

BACKGROUND OF THE INVENTION

Diamond-phase carbon (hereinafter known as diamond) CVD is the deposition or growth of diamond on a substrate material, starting with gaseous precursors. Initial work in the field of CVD growth of diamond concentrated on growth of thin films on flat substrates. Later research has extended the field to coating of non-planar materials (e.g. P W May et al, Proc 3rd Int Symp Diamond Mater, Honolulu 1993, Proceedings Volume PV 93-17, ed. J P Dismukes and K V Ravi (Electrochem Soc Pennington, N.J.), P1036). Advances in the field include fabrication of diamond-coated metal wires (e.g. Cu, Ti and W) and formation of hollow tubes of diamond by the subsequent removal of the wire substrate by etching. However, the production of long lengths hollow tubes by etching is severely hampered by the associated difficulty in etching of lengths of fibre.

It is also known to coat SiC fibres and ceramic fibres with diamond (P W May et al ibid and P W May et al, Journal of Materials Science Letters, 13, p247–249, 1994 respectively). Such fibres are suitable for incorporation into composite materials required to be substantially non-conducting.

DESCRIPTION OF THE INVENTION

According to this invention a method of diamond coating an elongate substrate material having a surface pre-treated to establish diamond nucleation sites comprises the steps of:

1. winding the elongate material into substantially a helical geometry wherein the pitch of the helix is less than the diameter of the helix;
2. encapsulation of the elongate substrate material by deposition of diamond on the elongate substrate material by chemical vapour deposition such that growth surfaces of diamond deposited upon adjacent pitches of the helix fuse such as to close the pitch of the helix and resulting in hollow diamond tubes.

Suitable elongate materials are those materials which will retain the helical geometry following preforming. Typically the materials are metals such as W, Cu, Mo, Si which are known to be substantially non-reactive within the gaseous environment of a diamond CVD chamber. However, other materials such as metals reactive to the diamond CVD gaseous precursors (e.g. steel) can be suitable for the diamond CVD process by the deposition of a inhibiting barrier layer on the surface of the reactive material prior to pre-treatment for the establishing of nucleation sites. Choice of suitable elongate material will result in the elongate material acting as a reinforcing element within the hollow diamond tubes.

Preferably the CVD process takes place in a vacuum chamber having a pressure of less than 40 Torr, although atmospheric pressure CVD using combustion torch methods (e.g. plasma arc jets or oxyacetylene torches) can be used in conjunction with suitable substrate temperature control devices preventing heating of the substrate to temperatures greater than 1000° C.

During the coating of the elongate material within the CVD chamber it is important that the material is immersed uniformly within the reactive gases. Typically this is achieved within a filament reactor by positioning the filament vertically and hanging the elongate material parallel to it (or passing the elongate material parallel to the filament for continuous processing) and about $5 \times 10^{-6}$ m away from the filament. Within such apparatus uniformity of diamond deposition is achieved most easily for material having dimensions of less than $200 \times 10^{-6}$ m in axes normal to the elongate axis of the material (e.g. diameter axis for material in the form of wire). Shadowing effects may appear on material having dimensions greater than $200 \times 10^{-6}$ m and can be overcome by the positioning of the material within the inside of filament coils of the apparatus.

Typical methods of establishing nucleation sites on the surface of the material include abrasion with substances such as diamond grit or passing the elongate material through a slurry of diamond particles of approximately $1-3 \times 10^{-6}$ m. Manufacture of tungsten wire by the pulling of hot tungsten wire through a diamond die inherently establishes nucleation sites.

In order to produce a free standing diamond tube according to this particular embodiment of the invention it is necessary for the elongate material to be formed having a pitch sufficiently large to enable uniform deposition on the entire surface of the elongate material prior to "fusing" of growth surfaces of the deposited diamond. Thus, under suitable helical geometries of elongate material as described below, the diamond as deposited according to this invention will grow uniformly on any particular portion of the elongate material in such a manner as to gradually reduce the pitch of the helix. Closure of the pitch occurs when growth has continued for a sufficient length of time that each growth surface in the plane of the pitch of the helix abuts another such growth surface, resulting in the fusing of the diamond surfaces.

Typically for elongate material in the form of a wire the pitch of the helix would be greater than twice the diameter of the wire. Where the pitch of the helix is smaller than given in the above criterion, then the internal walls of the tube will have portions of exposed elongate material. It is also necessary for production of hollow diamond tubes of the invention that the pitch of the elongate material be less than the diameter of the helix of the elongate material. This ensures that a hollow tube is produced rather than an enclosed tube. It will be apparent to one of ordinary skill in the art that particular inner and outer diameters and wall thickness of hollow diamond tubes produced in a manner according to this embodiment of the invention will be dependent upon the pitch of the helix of elongate material. It will also be apparent to one skilled in the art that production of free standing hollow diamond tubes in this manner will obviate the need for removal of substrate material by etching as described by the prior art with the advantage of providing reinforcement within the diamond tube.

It will be obvious to the person skilled in the art that tubes of this invention could be used as lightweight structural components having good thermal conduction or alternatively as coolant passages for small scale devices.

DESCRIPTION OF THE PREFERRED EMBODIMENT

The invention will now be described by way of example only.

A suitably pretreated elongate substrate material, e.g. tungsten, is wound around a stiff cylindrical former. Suitable formers include another length of tungsten or a length of SiC fibre. Suitable former diameters are within the range 10 to $200 \times 10^{-6}$ m. Following winding of the elongate material, relaxation of the means for winding the elongate material allows the resultant coil to be removed easily from the former.

The elongate material in the form of a helix is then arranged within a standard hot filament reactor for deposition of diamond by CVD. For coating of a static elongate material it is necessary that the material is arranged to be held tautly and firmly within the CVD chamber. This can be achieved by arranging for the elongate material to be weighted or springloaded.

The CVD chamber is normally a vacuum chamber suitable for operation at a few tens of Torrs. Forms of activation other than thermal include electrical discharge, radio frequency or microwave plasma, focused laser beams and combustion. Typical gas mixtures include hydrocarbons in an excess of hydrogen. Examples of suitable hydrocarbons include methane, acetone, acetylene and ethanol, usually at a ratio of about 1% hydrocarbon to 99% hydrogen. Optionally other gases are included for improvement of growth rates. Suitable additives include oxygen or $CF_4$. It is also possible to add $BCl_3$ to the gas mixture for p-doping of the resultant diamond grown according to these standard CVD processes.

The elongate material is heated to a suitable temperature, typically above 700° C. This is usually performed by an independent heater unit or alternatively from a gas activation source (e.g. radiative heating from a plasma or filament).

Growth rates vary according to the power input. Typical growth rates are about $1-4 \times 10^{-6}$ m per hour, but 100 kW microwave systems are quoted as capable of growth rates of $50-100 \times 10^{-6}$ m per hour. It will be apparent to one skilled in the art that the growth rate will also be dependent on a number of factors concerning the particular CVD process employed. However, with a vacuum chamber pressure of 20 Torr of gaseous flow of 200 sccm of hydrogen and 2 sccm of methane, heating of a tantalum filament to approximately 2000° C. and tungsten wire elongate material to approximately 900° C., and maintenance of a typical gap of $5 \times 10^{-6}$ m between the filament and the elongate material the resultant growth rate of $1 \times 10^{-6}$ m per hour is achieved.

I claim:

1. A method of diamond coating an elongate substrate material to form a hollow diamond tube, having a surface pretreated to establish diamond nucleation sites, comprising the steps of:
   (i) on a former winding the elongate material into substantially a helical geometry wherein the pitch of the helix is less than the diameter of the helix and removing the former, and
   (ii) encapsulating the elongate helix of the substrate material prepared in step
       (i) by depositing diamond on the elongate substrate material by chemical vapor deposition to form a continuous diamond film such that growth surfaces of the diamond deposited upon adjacent pitches of the helix fuse to close the pitch of the helix and resulting in said hollow diamond tube.

2. The method according to claim 1 wherein the elongate material is selected from the group consisting of tungsten, copper, molybdenum and silicon.

3. The method according to claim 1 wherein the elongate material is reactive with diamond chemical vapor deposition precursors, and has an inhibiting barrier layer deposited on its outer surface.

4. The method according to claim 1 to wherein the elongate material is substantially circular cross-section wire.

5. The method according to claim 4 wherein the pitch of the helix is greater than twice the diameter of the wire.

* * * * *